United States Patent
Chou et al.

(10) Patent No.: US 9,457,412 B2
(45) Date of Patent: Oct. 4, 2016

(54) FABRICATION METHOD FOR DIAMOND FILM COATING OF DRILL BIT

(75) Inventors: Yuag-Shan Kevin Chou, Tuscaloosa, AL (US); Raymond G. Thompson, Hoover, AL (US)

(73) Assignee: The Board of Trustees of the University of Alabama for and on behalf of the University of Alabama, Tuscaloosa, AL (US)

( * ) Notice: Subject to any disclaimer, the term of this patent is extended or adjusted under 35 U.S.C. 154(b) by 899 days.

(21) Appl. No.: 13/511,991

(22) PCT Filed: Dec. 28, 2010

(86) PCT No.: PCT/US2010/062218
§ 371 (c)(1),
(2), (4) Date: Apr. 22, 2013

(87) PCT Pub. No.: WO2011/082161
PCT Pub. Date: Jul. 7, 2011

(65) Prior Publication Data
US 2013/0209183 A1    Aug. 15, 2013

Related U.S. Application Data

(60) Provisional application No. 61/290,288, filed on Dec. 28, 2009.

(51) Int. Cl.
| B23B 51/00 | (2006.01) |
| C23C 16/27 | (2006.01) |
| B23B 51/02 | (2006.01) |
| B23P 15/32 | (2006.01) |
| C23C 30/00 | (2006.01) |

(52) U.S. Cl.
CPC ............... *B23B 51/00* (2013.01); *B23B 51/02* (2013.01); *B23P 15/32* (2013.01); *C23C 16/274* (2013.01); *C23C 30/005* (2013.01); *B23B 2226/315* (2013.01); *B23B 2228/105* (2013.01); *Y10T 407/1904* (2015.01)

(58) Field of Classification Search
CPC .................. B23B 2226/315; B23B 2228/105; B23B 51/00; B23B 51/02; B23P 15/32; C23C 16/274; C23C 30/005; Y10T 407/1904
See application file for complete search history.

(56) References Cited

U.S. PATENT DOCUMENTS

| | | | |
|---|---|---|---|
| 3,038,475 A * | 6/1962 | Orcutt | A61B 17/06066 163/5 |
| 5,137,398 A | 8/1992 | Omori et al. | |
| 5,338,135 A | 8/1994 | Noguchi et al. | |
| 5,370,944 A | 12/1994 | Omori et al. | |
| 5,585,176 A | 12/1996 | Grab et al. | |
| 5,628,837 A | 5/1997 | Britzke et al. | |
| 5,653,812 A | 8/1997 | Petrmichl et al. | |
| 5,713,133 A | 2/1998 | Bhat et al. | |
| 5,716,170 A | 2/1998 | Kammermeier et al. | |
| 5,762,538 A * | 6/1998 | Shaffer | B24B 1/00 408/144 |
| 5,897,924 A * | 4/1999 | Ulczynski | C03C 17/22 427/109 |
| 6,224,972 B1 * | 5/2001 | Nordgren et al. | 428/336 |

(Continued)

*Primary Examiner* — Hwei C Payer
(74) *Attorney, Agent, or Firm* — Maynard Cooper & Gale, P.C.; Jon E. Holland

(57) ABSTRACT

Tungsten carbide drill bits for removing material from alloys and other hard materials are disclosed. A conventional drill bit is modified by removing material from the forward portion of the bit to increase the radius of the cutting edge. The drill bit is then coated with a nanostructured diamond film using a chemical vapor deposition process.

15 Claims, 7 Drawing Sheets

(56) References Cited

U.S. PATENT DOCUMENTS

| | | |
|---|---|---|
| 6,319,610 B1 | 11/2001 | Zimmer |
| 7,008,672 B2 | 3/2006 | Gordeev et al. |
| 2003/0039522 A1 | 2/2003 | Yanagida et al. |
| 2004/0031438 A1 | 2/2004 | Sung |
| 2006/0147631 A1 | 7/2006 | Lev et al. |
| 2006/0175953 A1* | 8/2006 | Swain ................ C25B 11/0442 313/311 |
| 2007/0284255 A1 | 12/2007 | Gorokhovsky et al. |
| 2008/0019787 A1 | 1/2008 | Sampath et al. |
| 2009/0239078 A1* | 9/2009 | Asmussen ............ C23C 16/274 428/408 |
| 2010/0209665 A1* | 8/2010 | Konovalov ............ B82Y 30/00 428/141 |
| 2012/0301239 A1* | 11/2012 | Prom ...................... B23B 51/02 408/226 |
| 2013/0209183 A1* | 8/2013 | Chuo ...................... B23B 51/02 407/32 |

* cited by examiner

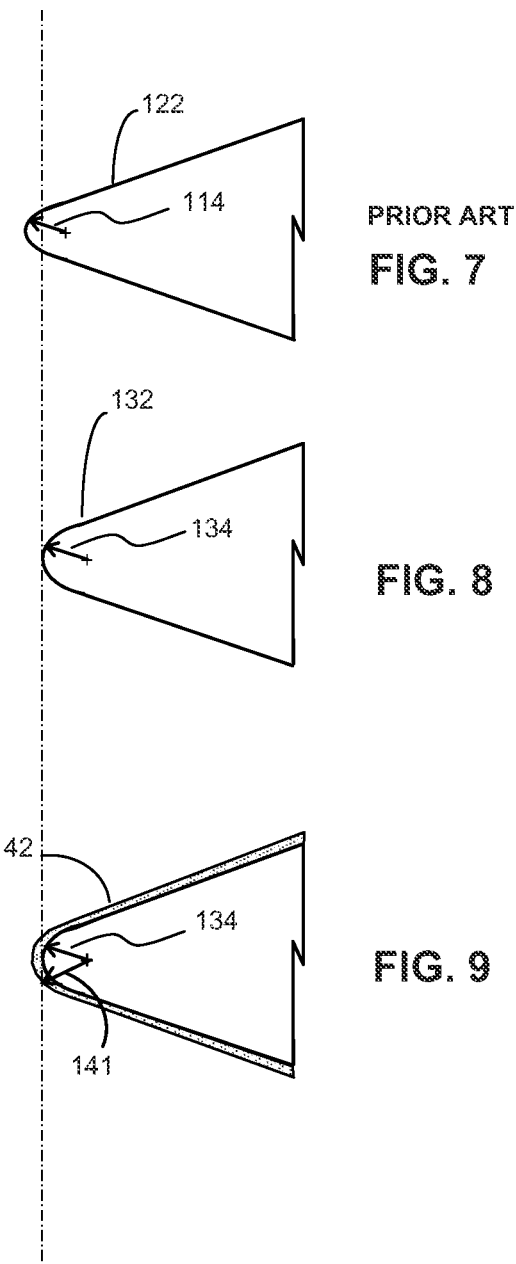

| | Drill Bit Description | Estimated Radius of Edge | Drill Life by Number of Holes | Comments |
|---|---|---|---|---|
| 352 | As-received, uncoated | 3 to 7 μm | 25 | Flute severely clogged, out of spec holes, breakage |
| 354 | No edge preparation, coated | 3 to 7 μm | 40 | Drill breakage |
| 356 | Small edge hone, coated | 8 to 15 μm | >100 | No drill breakage, testing stopped for drill evaluation |
| 358 | Large edge hone, coated | 15 to 25 μm | >100 | No drill breakage, testing stopped for drill evaluation |

Drill Bit Performance

FABRICATION METHOD FOR DIAMOND FILM COATING OF DRILL BIT

CROSS REFERENCE TO RELATED APPLICATION

This is a national stage application of International Application No. PCT/US10/62218, entitled "Fabrication Method for Diamond Film Coating of Drill Bit," and filed Dec. 28, 2010, which is incorporated herein by reference and claims priority to U.S. Provisional Patent Application No. 61/290,288, entitled "Methods for Coating Drill Bits" and filed on Dec. 28, 2009, which is incorporated herein by reference.

FIELD OF THE INVENTION

The present invention generally relates to the field of coated drill bits, and particularly to drill bits coated with a hard material to improve drill bit performance.

BACKGROUND

A drill bit is a cutting tool for "drilling" a hole in a work piece made of a variety of materials, such as wood, metal, plastic, and alloys. In general, it is difficult to drill multiple holes in hard material, such as a high-strength alloy, particularly when the cutting edges of the drill bit become ineffective as the drill bit is dulled by repeated use caused by the abrasive properties of the hard material. Diamond coatings applied to the cutting edges of a drill bit have overcome some of the problems associated with drilling hard materials. However, diamond coatings on the drill bit often separates from the drill bit material (serving as substrate for the coating) after intensive and continuous use. A useful, although comparatively expensive, coating is a polycrystalline diamond (PCD) coating that is applied by brazing. To reduce cost other methods of applying diamond containing coatings are often used. However, some of the other methods of applying diamond coatings have problems with coating/substrate separation.

The structure of a conventional drill bit 10 is depicted in FIG. 1. The cutting edges of the bit are on the forward end of the bit and are adjacent to the chisel edge of the bit. As the drill bit rotates cutting edges remove material from a work piece to form a hole. Because the drill bit surface, such as a diamond coating, is harder than the material of the work piece, the rotating cutting edges remove the softer material of the work piece. The pieces of material resulting from the removal process are transferred beyond the cutting edges of the drill bit via grooves in the drill bit.

In general, materials for drill bits are made of high-speed steel or tungsten carbide (CW). The front portion of the body of the drill bit that receives a coating, such as a diamond coating, is sometimes referred to as a substrate. When a harder material is applied to the substrate, such as a diamond coating, the drill bit performance is usually improved. Although the material typically used to form the body of a drill bit has excellent toughness, such materials frequently have poor wear resistance when used to machine hard materials, such as A390 alloys. It is generally known that there are several coatings, such as, carbide coatings and diamond coatings, that have excellent in wear resistance when bonded or otherwise applied to the drill bit substrate. However, some coatings may be brittle or may separate from the substrate due to drill bit manufacturing limitations. There is need to improve the coating process so that drill bit performance is improved.

BRIEF DESCRIPTION OF THE DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

FIG. 7 depicts a cross sectional view of a cutting edge of an etched conventional drill bit.

FIG. 8 depicts a cross sectional view of the cutting edge of the drill bit of FIG. 7 after a layer of material has been removed in accordance with the present disclosure.

FIG. 9 depicts a cross sectional view of an embodiment of a cutting edge for an improved drill bit in accordance with the present disclosure.

FIG. 12 shows performance results comparing conventional drill bits with embodiments of the improved bit of the present disclosure.

DETAILED DESCRIPTION

Figure 1:
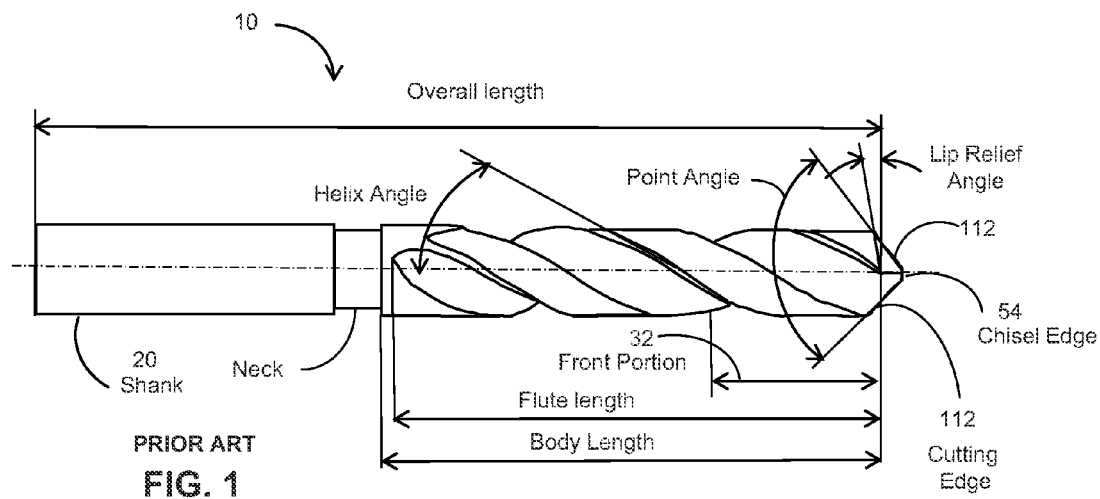
FIG. 1 shows a conventional drill bit and identifies some of structural elements of a drill bit.
Figure 2:
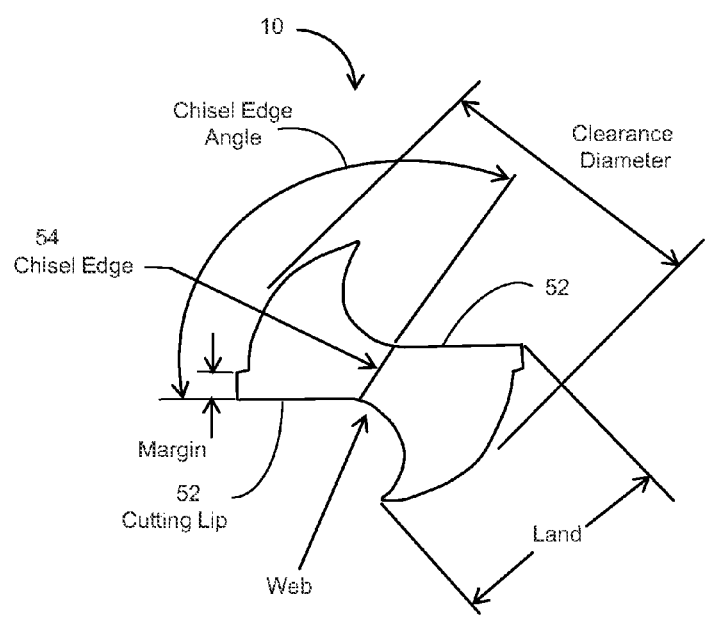
FIG. 2 is an end view of the drill bit of FIG. 1 showing details of the cutting portion of the drill bit.

The present disclosure generally pertains to drill bits, such as depicted in FIG. 1. Typically a conventional drill bit 10, shown as a two fluted bit, is made of a material, such as tungsten carbide, that is harder than a work piece (not shown) where the drill bit is used for drilling a hole. The drill bit has a shank 20 that is used to couple the drill bit 10 to a drill (not shown). The forward or front portion 32 of the drill bit that removes material from the work piece has two cutting edges 112. The cutting edges 112 are formed by surfaces of cutting lip 52 best seen in FIG. 2. A chisel edge 54 extends between the two cutting lips 52 of the drill bit 10. Other machine tools, such as a milling machine, use bits having cutting edges for removing material from a work piece. Such bits used in other machines would have improved performance if the cutting edges of the bits were processed using the edge coating method and system described herein.

Figure 3:
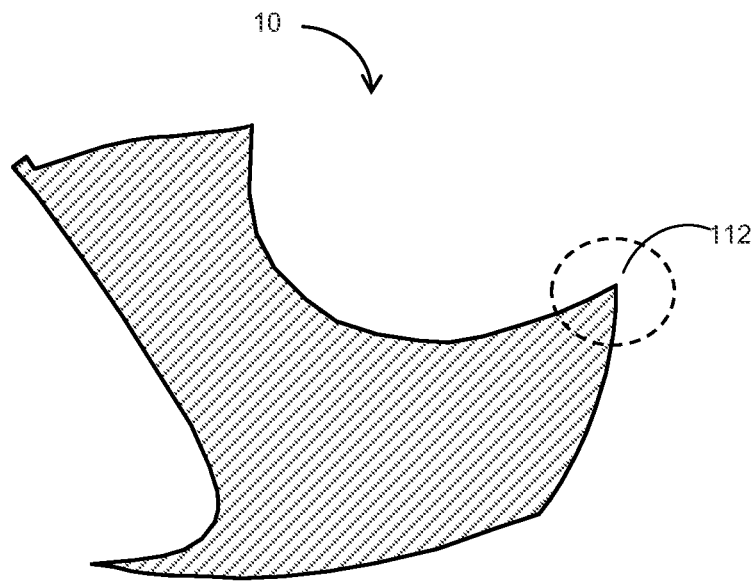
FIG. 3 depicts a cross sectional view of the conventional drill bit of FIG. 1.
Figure 4:
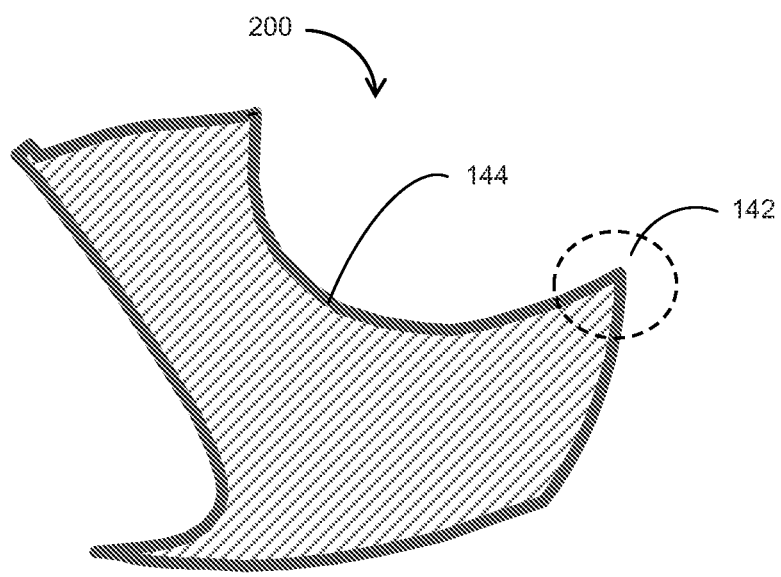
FIG. 4 depicts a cross sectional view of a drill bit having a modified cutting edge and a coating in accordance with the present disclosure.

FIG. 3 is a cross sectional view of drill bit 10 that shows a side view of one of the cutting edges 112. The processing, as will be described below, for coating the forward end of the drill bit with a nanostructure diamond film results in an improved drill bit with improved performance. FIG. 4 is a cross sectional view of an improved drill bit 200 having a diamond coating 144 on the forward portion of a modified drill bit and forms cutting edge 142. For one embodiment of the present disclosure about one third the forward portion of the drill bit is diamond coated. For other embodiments other portions of the drill bit receive the diamond coating.

In a conventional manufacturing process, a diamond coating is applied to a portion of a conventional drill bit of tungsten carbide. The diamond coating is applied to a prepared surface that is conditioned to receive the coating. The portion of the drill bit that receives the coating is generally free of contaminates to ensure that a good bond is created between the drill bit and the coating. In general, diamond coatings are created and applied to at high temperatures, such as 800° C. or more. After a diamond coating of a desired thickness has been applied to the drill bit, the diamond coated drill bit cools down from around 800° C. to an ambient temperature of around 25° C. During the cool down, mismatch stresses are generated due to the differences in coefficients of thermal expansion between tungsten carbide and the diamond coating. The cool down stresses tend to pull the coating from the substrate. However, there is sufficient adherence between the diamond coating and the substrate to keep the diamond coating in place. The resulting coated drill bit, produced by the conventional process, has better performance than an uncoated drill bit. However, when the coated conventional drill bit was used to drill holes in a hard alloy the coated drill bit failed after drilling around 40 holes. If there was a process that could provide a drill bit with a lower failure rate then the productive time of a drilling machine would be increased. The cause of conventional drill bit failure, typically breakage, is unknown but it may have been due to the combination of the residual thermal stress and the stress of repeated and intensive drilling.

Figure 5:
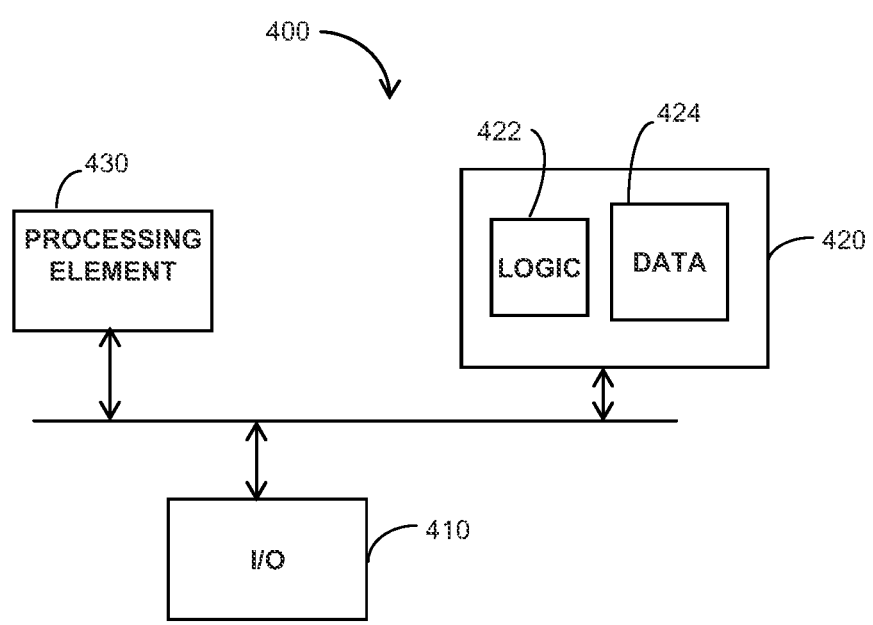
FIG. 5 depicts a system for determining values of parameters for embodiments of improved drill bits of the present disclosure.

A system 400 for determining drill bit parameters in order to manufacture and improved coated drill bit is shown in FIG. 5. The system 400 has a processing element 430, memory unit 420 and an input/output device 410, such as a keyboard and video monitor. Stored data 424 in memory unit 420 includes drill bit geometry, such as cutting edge radius and number of cutting edges, and the physical parameters of the drill bit materials and coatings, such as, for example, Young's Modulus, thermal expansion coefficients and Poisson's ratio. Logic 422 for the system 400 process the data in processor element 430 and is based on finite element analysis (FEA).

Figure 6:
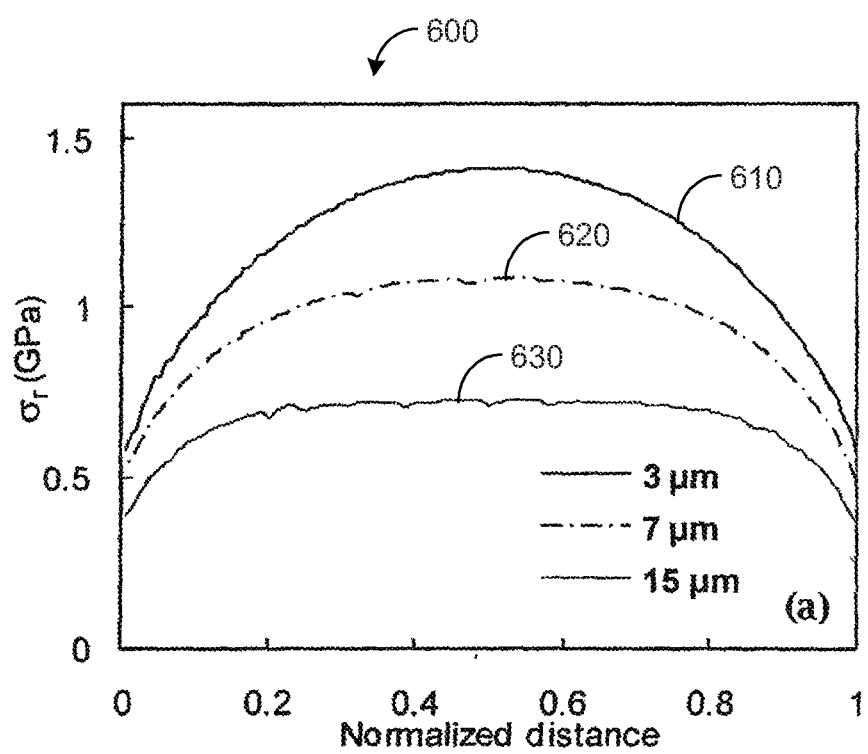
FIG. 6 shows curves of radial stress as a function of normalized cutting edge radii as determined the system of FIG. 5.

The system 400 determines values of drill bit parameters that result in improved drill bit performance. The system 400 also determined that there were several ways to improve drill bit performance, but the best of the several ways was to dull the cutting edge of the drill bit before applying the diamond coating. Hence, system 400 determines several parameters that may be changed to improve drill bit performance. The system 400 determined for the materials used in one embodiment that changing the edge radius was the most significant way to relieve stress as shown by stress curves 600 of FIG. 6. The radial stress as shown is the stress that pulls a coating away from a substrate. A conventional drill bit 10 has cutting edge 112 with an edge radius of around 3 μm up to around 7 μm. Stress curve 610 shows how radial stress varies for the 3 μm radius edge and stress curve 620 shows how radial stress varies for the 7 μm radius edge. If the radius of the cutting edge is modified so that it is increased to 15 μm, then the modified cutting edge is considered to be dull compared to the cutting edges of the conventional drill bit. Stress curve 630 shows that radial stress is reduced on a cutting edge with a radius of 15 μm. System 400 has demonstrated that the radial stress between the drill bit material substrate and the diamond coating has been reduced around 50% when the cutting edge is dulled, as described above. Hence, dulling the drill bit before coating will reduce separation stresses. In one embodiment system 400 uses two dimensional FEA and in another embodiment uses three dimensional FEA. In summary system 400 determines how to make a better drill bit, such as reducing thermal mismatch stresses by dulling cutting edges before applying a diamond coating to a tungsten carbide drill bit. In other embodiments having different coating materials and different drill bit materials (substrates) other parameters may be changed to improve drill bit performance.

In order to evaluate the performance of a diamond coated drill bit having an increased edge radius, a process was developed as depicted FIGS. 7 through 9. FIG. 7 depicts a cross sectional view of an etched cutting edge 122 of a conventional drill bit 10, such as a bit made of tungsten carbide. Note that an etched edge radius 114, as shown in FIG. 7, is approximately the same as a conventional edge radius of a conventional drill bit 10. The conventional cutting edge 112 has an edge radius of between 3 micrometers (μm) and 7 μm. The next step for making an improved drill 200 bit comprises modifying the etched cutting edge 122 so that the cutting edge is dull with respect to cutting edge 122. By removing material from cutting edge 122 a new cutting edge 132 is provided. The new cutting edge 132 has a radius 134 of 15 μm or more. Hence, it could be said that the new cutting edge 132 having a radius of 15 μm is only about half as sharp as the etched cutting edge 122 having a radius of 7 μm. After making the cutting edge duller, a diamond coating 144 is applied as shown in FIG. 9. The improved cutting radius 141 of the improved cutting edge 142 has been made somewhat greater than radius 134 because of the application of the diamond coating 144 which has a thickness of between around 5 μm to 10 μm.

In one embodiment the increased radius is formed by precision sandblasting, but other methods, such as honing, of increasing the radius are used in other embodiments. Upon completing of step of increasing the radius of the edge, the drill bit is in condition to receive a diamond coating.

In one embodiment, the diamond coating is applied using microwave plasma assisted chemical vapor deposition (MP-CVD) technology. In other embodiments other coating methods are used. FIG. 9 depicts a cross sectional view of an improved edge 142 where the dulled edge 132 is coated with a nanostructured diamond (NSD) film 144.

Figure 10:
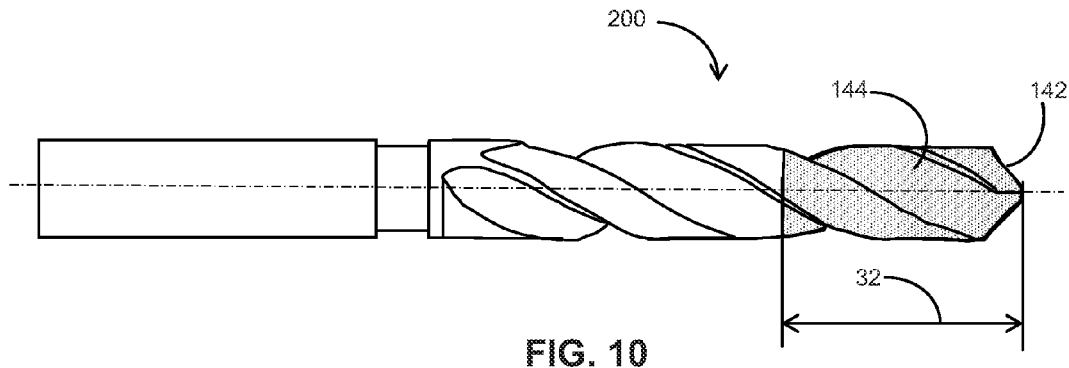
FIG. 10 depicts an embodiment of a drill bit in accordance with the present disclosure.

FIG. 10 depicts an improved drill bit 200 having the diamond coating applied as described above. The forward portion of the bit is coated so that about 30% of the body of the improved drill 200 has a diamond coating. In other embodiments other percentages of coating are possible.

Figure 11:
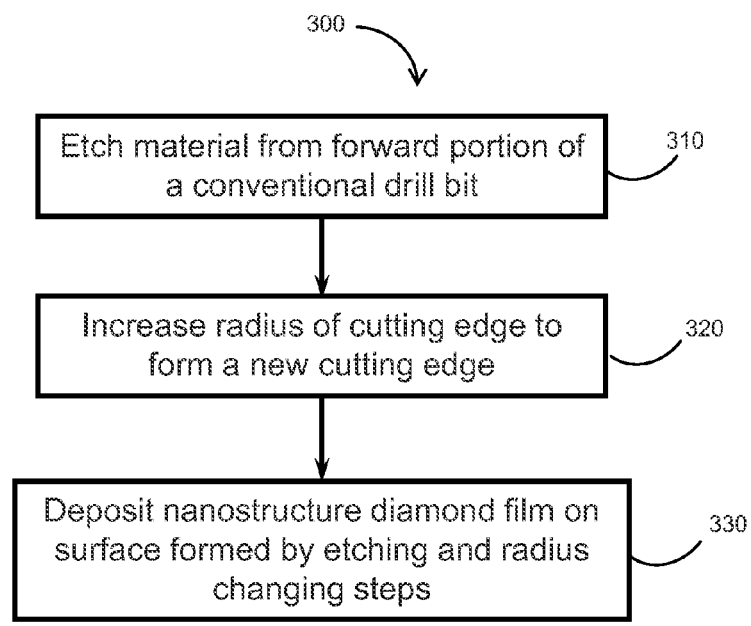
FIG. 11 shows a method embodiment for manufacturing an improved drill bit of the present disclosure.

FIG. 11 illustrates a method embodiment 300 for making the improved drill bit 200. A desired radius for the cutting edge is selected based on the expected stresses that are likely to occur when a coating is applied to the drill bit. Such stresses are dependent on several factors, including the geometry and physical parameters of the drill bit as well as the coating material to be used. Material is removed, such as by etching, from the front portion of a conventional drill bit, step 110. Next, the radius of cutting edge of the bit is increased by sandblasting or honing, step 320, until selected radius value is reached. It would be understood by those knowledgeable of cutting edges that increasing the radius makes the drill bit duller. Next, step 330, a nanostructure diamond film is deposited on the processed portion of the drill bit having the edge with the increased radius. The method embodiment 300 as described results in an improved drill bit 200.

In order to determine the drilling characteristics of improved drill bit 200 having the improved edge 142, comparison tests were performed. FIG. 12 is a drill bit performance table 350 that shows performance of conventional drill bits and embodiments of improved drill bit 200. As seen in table 350, the improved drill bit 200 drilled more than 100 holes, row 356 and 358, without breakage. The conventional drill bit with the conventional edge and no coating failed after drilling 25 holes, row 352, and the diamond coated drill bit with the convention edge failed after drilling 40 holes, row 354. Hence, the improved drill bit 200 has performance exceeding the conventional bit 10, even when conventional bit is diamond coated. Drill bit performance is improved by a factor greater than two. Hence, making the cutting edge duller has resulted in an improved drill bit.

Although the disclosure is described in several embodiments, a variety of changes and modifications would be apparent to those skilled in the art without departing from the spirit and scope of the disclosure.

Now, therefore, the following is claimed:

1. A method for fabricating a drill bit, comprising:
   etching material from a forward portion of a drill bit, wherein the forward portion has cutting edge with a first radius;
   analyzing thermal stresses expected for the drill bit;
   selecting a second radius for the cutting edge based on the analyzing, the second radius being greater than the first radius;
   increasing the radius of the cutting edge so the cutting edge has the second radius; and
   depositing a coating on the etched drill bit with the second radius.

2. The method of claim 1, wherein the depositing is performed via microwave plasma assisted chemical vapor deposition, and wherein the increasing is performed via sandblasting.

3. The method of claim 1, wherein the depositing comprises providing a nanostructured diamond film as the coating.

4. The method of claim 1, wherein the increasing is performed via sandblasting.

5. The method of claim 1, wherein the increasing is performed via honing.

6. The method of claim 1, wherein the increasing results in the second radius being greater than 15 micrometers (μm).

7. The method of claim 1, wherein the increasing results in the second radius being at least two times the first radius.

8. The method of claim 1, wherein the depositing comprises providing diamond as the coating.

9. The method of claim 1, wherein the depositing comprises selecting a material for the coating that is harder than a material of the drill bit.

10. A method for fabricating a drill bit, comprising:
    analyzing thermal radial stresses expected for a drill bit, wherein a forward portion of the drill bit has a cutting edge with a first radius;
    selecting a second radius for the cutting edge based on the analyzing, the second radius being greater than the first radius;
    preparing the forward portion of the drill bit to receive a coating of material, wherein the preparing comprises increasing the first radius of the cutting edge so the cutting edge has the second radius for reducing thermal radial stresses in the drill bit when the coating is applied to the forward portion; and
    depositing the coating on the prepared forward portion of the drill bit having the second radius.

11. The method of claim 10, wherein the depositing is performed via microwave plasma assisted chemical vapor deposition.

12. The method of claim 11, wherein the depositing comprises providing a nanostructured diamond film as the coating.

13. The method of claim 12, further comprising heating the forward portion to a temperature greater than 700 degrees Celsius, wherein the depositing is performed while the forward portion is at the temperature, and wherein the second radius is selected to reduce thermal radial stresses in the drill bit as the coated drill bit cools from the temperature.

14. The method of claim 10, wherein the depositing comprises selecting a material for the coating that is harder than a material of the forward portion.

15. The method of claim 14, wherein the depositing comprises providing diamond as the coating.

* * * * *